United States Patent
Wang (10) Patent No.: US 8,183,578 B2
(45) Date of Patent: May 22, 2012

(54) DOUBLE FLIP-CHIP LED PACKAGE COMPONENTS

(75) Inventor: Chung Yu Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 274 days.

(21) Appl. No.: 12/715,795

(22) Filed: Mar. 2, 2010

(65) Prior Publication Data

US 2011/0215354 A1    Sep. 8, 2011

(51) Int. Cl.
H01L 27/15 (2006.01)
H01L 31/12 (2006.01)
H01L 33/00 (2010.01)

(52) U.S. Cl. .................. 257/79; 257/698; 257/E33.001

(58) Field of Classification Search ............. 257/79, 257/99, 698, 778, 780, 781, E33.001, E31.127
See application file for complete search history.

(56) References Cited

U.S. PATENT DOCUMENTS

| | | | |
|---|---|---|---|
| 7,989,270 B2 * | 8/2011 | Huang et al. | 438/127 |
| 2004/0188696 A1 | 9/2004 | Hsing Chen et al. | |
| 2006/0278885 A1 | 12/2006 | Tain et al. | |

* cited by examiner

*Primary Examiner* — Hoai V Pham
(74) *Attorney, Agent, or Firm* — Haynes and Boone, LLP (57) ABSTRACT

A light-emitting device (LED) package component includes an LED chip and a carrier chip. The carrier chip includes a first and a second bond pad on a surface of the carrier chip; and a third and a fourth bond pad on the surface of the carrier chip and electrically connected to the first and the second bond pads, respectively. The first, the second, the third, and the fourth bond pads are on a same surface of the carrier chip. The LED package component further includes a first and a second metal bump bonding the first and the second bond pads, respectively, onto the LED chip through flip-chip bonding; and a window-type module substrate bonded onto the third and the fourth bond pads through flip-chip bonding. The window-type module substrate includes a window, with the LED chip configured to emit light toward the window.

20 Claims, 6 Drawing Sheets

FIG. 7

DOUBLE FLIP-CHIP LED PACKAGE COMPONENTS

TECHNICAL FIELD

This disclosure relates generally to light-emitting device (LED) package components, and more particularly to LED package components including through-substrate vias (TSVs).

BACKGROUND

In recent years, optical devices, such as light-emitting diodes (LED), laser diodes, and UV photo-detectors have increasingly been used. Group-III nitride compounds, such as gallium nitride (GaN) and their related alloys, have been known suitable for the formation of the optical devices. The large bandgap and high electron saturation velocity of the group-III nitride compounds also make them excellent candidates for applications in high-temperatures and high-speed power electronics.

Figure 1:
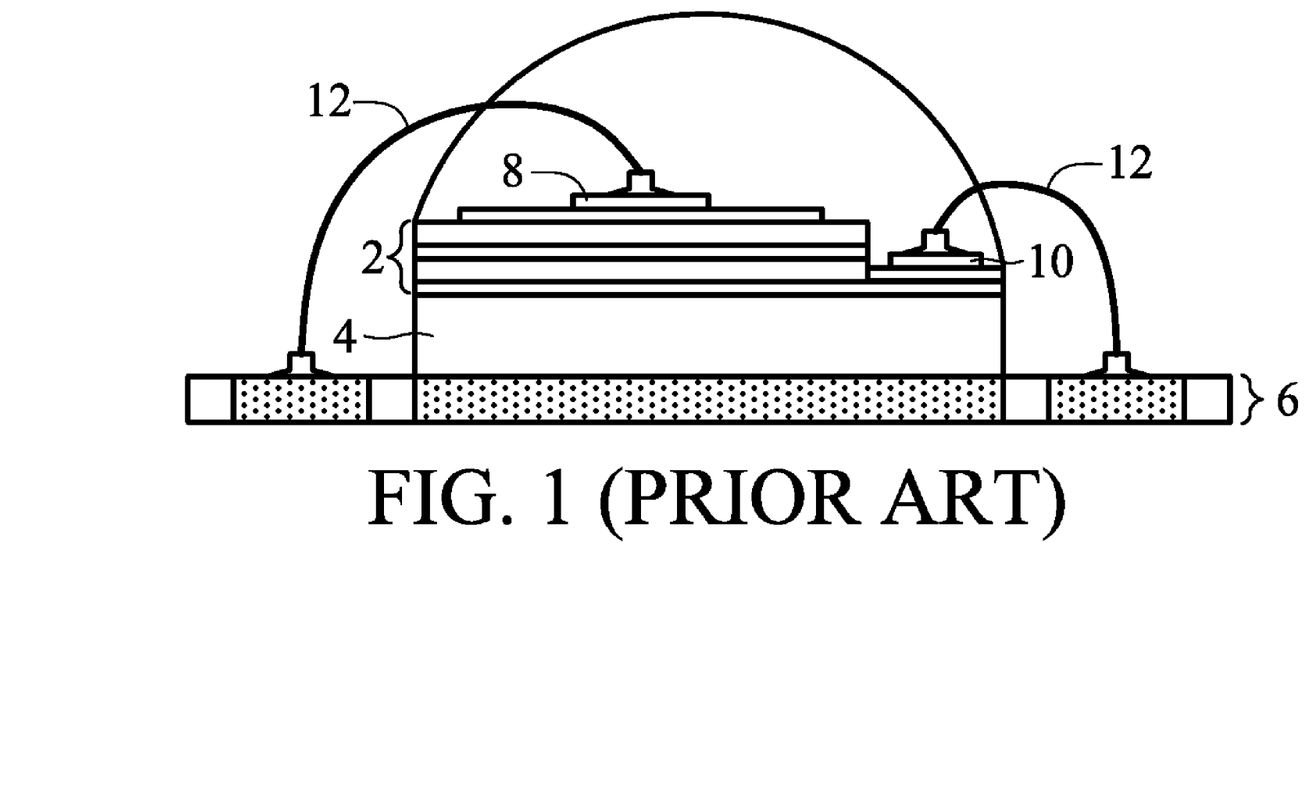
FIG. 1 illustrates a cross-sectional view of a conventional light-emitting device (LED) package structure formed on a sapphire substrate.

Due to the high equilibrium pressure of nitrogen at typical growth temperatures, it is extremely difficult to obtain GaN bulk crystals. Therefore, GaN layers and the respective LEDs are often formed on other substrates that match the characteristics of GaN. Sapphire ($Al_2O_3$) is a commonly used substrate material. FIG. 1 illustrates a cross-sectional view of an LED package component. LED 2, which includes a plurality of GaN-based layers formed on sapphire substrate 4. Sapphire substrate 4 is further mounted on lead frame 6. Electrodes 8 and 10 electrically connect LED 2 onto lead frame 6 through gold wires 12.

Sapphire has a low thermal conductivity. Accordingly, the heat generated by LED 2 cannot be dissipated efficiently through sapphire substrate 4. Instead, the heat is mostly dissipated through the top end of LED 2 and through gold wires 12. However, the necessary length of gold wires 12 to extend to lead frame 6 renders the heat-dissipating efficiency low. In addition, electrode 10 occupies chip area and reduces the total chip area available for LED light output.

SUMMARY

In accordance with one aspect, a light-emitting device (LED) package component includes an LED chip and a carrier chip. The carrier chip includes a first and a second bond pad on a surface of the carrier chip; and a third and a fourth bond pad on the surface of the carrier chip and electrically connected to the first and the second bond pads, respectively. The first, the second, the third, and the fourth bond pads are on a same surface of the carrier chip. The LED package component further includes a first and a second metal bump bonding the first and the second bond pads, respectively, onto the LED chip through flip-chip bonding; and a window-type module substrate bonded onto the third and the fourth bond pads through flip-chip bonding. The window-type module substrate includes a window, with the LED chip configured to emit light toward the window.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel light-emitting device (LED) package component and the method of forming the same are presented. The intermediate stages of manufacturing an embodiment are illustrated. The variations of the embodiment are then discussed. Throughout the various views and illustrative embodiments, like reference numbers are used to designate like elements.

Figure 2:
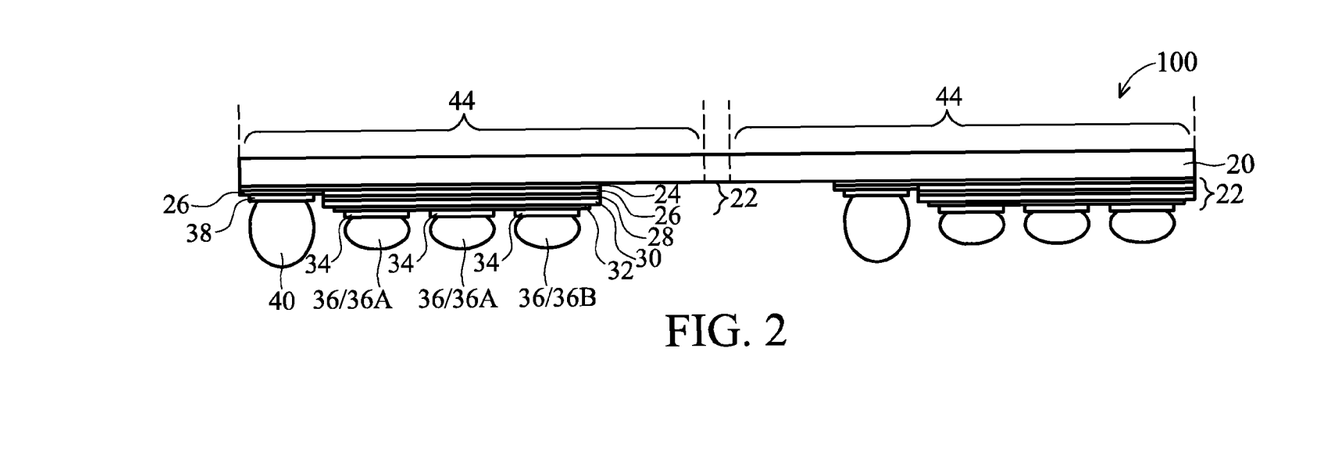
FIGS. 2 through 7 are cross-sectional views of intermediate stages in the manufacturing of a package component including an LED in accordance with various embodiments.

FIG. 2 illustrates wafer 100, which includes LEDs 22 formed on substrate 20. In an embodiment, substrate 20 is formed of sapphire ($Al_2O_3$, which is transparent), although it may also be formed of other materials having characteristics close to the characteristics of the layers in LEDs 22 (which may comprise group-III and group-V elements, or also known as III-V compound semiconductor materials). Substrate 20 may also be a silicon carbide substrate, a silicon substrate with a silicon carbide layer thereon, a silicon germanium substrate, or other applicable semiconductor substrates.

In an exemplary embodiment, un-doped gallium nitride (u-GaN) layer 24 is formed on, and possibly contacts, substrate 20. In an embodiment, u-GaN layer 24 is substantially free from elements other than Ga and N. LEDs 22 are formed on, and may possibly contact, u-GaN layer 24. LEDs 22 may include a plurality of layers. In an exemplary embodiment, each of LEDs 22 include n-GaN layer (GaN doped with an n-type impurity) 26, multiple quantum well (MQW) 28, p-GaN layer (GaN doped with a p-type impurity) 30, reflectors 32, and top electrodes (which are also bond pads) 34. Reflectors 32 may be formed of a metal, such as aluminum or copper. MQWs 28 may be formed of, for example, InGaN, and act as active layers for emitting light. The formation of layers 26, 28, 30, 32, and 34 are known in the art, and hence details are not repeated herein. In an exemplary embodiment, the formation methods of layers 26, 28, and 30 include epitaxial growth. LEDs 22 may have many designs and FIG. 2 only shows an exemplary version among the available variations. For example, the materials of each of layers 26, 28, and 30 may be different from the above-discussed materials, and may include ternary III-V compound semiconductor materials, such as GaAsP, GaPN, AlInGaAs, GaAsPN, AlGaAs, and the like. Also, the positions of n-GaN layer 26 and p-GaN layer 30 may be swapped.

Each of LEDs 22 further comprise bond pads 38, which are used to connect to n-GaN layer 26. Accordingly, bond pads 34 and 38 are used to apply a voltage to the respective LED 22, so that the respective LED 22 is activated to emit light. In an embodiment, at least one of electrodes 34 in each of LEDs 22 has a current flowing through during the usage (light emission) of LED 22, while one or more electrodes 34 are dummy electrodes, which do not have any current flowing through when the voltage is applied.

Solder bumps 36 (including active solder bumps 36B and dummy solder bumps 36A) and 40 are formed on LEDs 22. Solder bumps 36 and 40 may be formed of commonly used solder materials, such as lead-free solders, eutectic solders, or the like. After the formation of solder bumps 36 and 40, wafer 100 is diced into a plurality of LED chips 44, with each of the LED chips 44 comprising one or more LED 22. In the embodiment wherein each LED chip 44 includes more than one LED chip 44 on a same substrate 20, the LEDs 22 in the same LED chips are referred to as LED tiles. After LED chips 44 are sawed from wafer 100, bevel cuts 42 (not shown in FIG. 2, please refer to FIG. 4) may be formed at the edges of LED chips 44, so that the respective edge forms a slant angle (not equal to 90 degrees) with the surface plane of the respective substrate 20. Bevel cuts 42 may reduce the stress in the resulting package structure.

Figure 3:
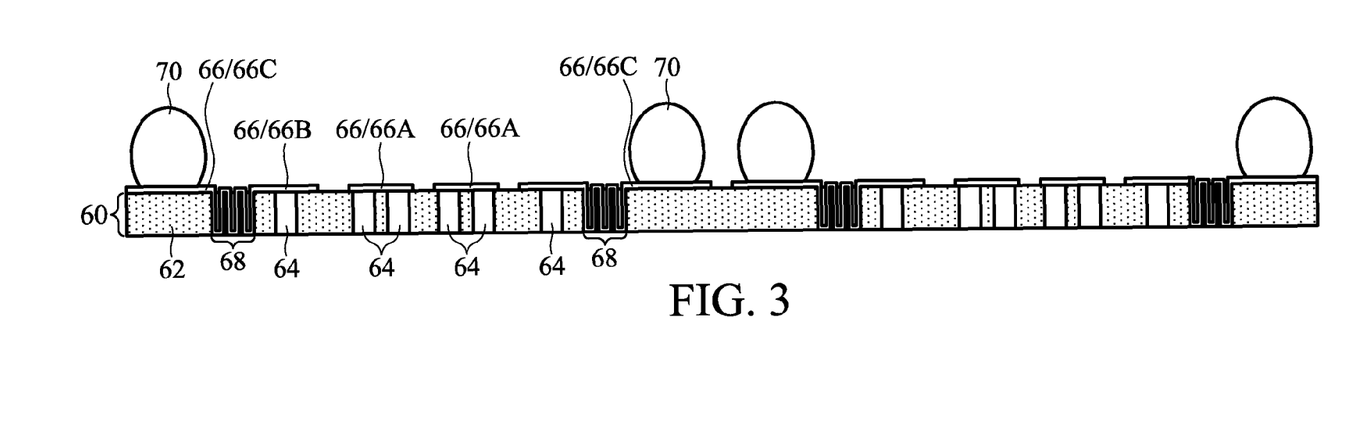

Referring to FIG. 3, carrier wafer 60 is provided. Carrier wafer 60 comprises substrate 62, which may be a semiconductor substrate, such as a silicon substrate, or may be a dielectric substrate. Through-substrate vias (TSVs) 64 are formed in substrate 62, and may electrically connect features on opposite sides of substrate 62. TSVs 64 may be formed of copper or other metals, such as tungsten, or alloys thereof. Bond pads 66 (including 66A, 66B, and 66C) are formed on one side of carrier wafer 60 and connect to TSVs 64.

Dummy TSVs 64 dissipate heat and are not used to conduct currents, although voltages may be applied during operation. Throughout the description, dummy TSVs 64 may be referred to as thermal TSVs. Bond pads 66 that are designed to have current flowing through during LED operation are referred to as active bond pads 66B, while the bond pads 66 that do not have current flowing during the LED operation are referred to as dummy bond pads 66A. Optional conductive lines 68 are formed in or on carrier wafer 60 to connect bond pads. Conductive lines 68 may be ohmic lines or metal lines having negligible resistances.

Solder bumps 70 are formed on some of bond pads 66 (referred to as bond pads 66C hereinafter). Bond pads 66C are connected to active bond pads 66B through conductive lines 68.

Figure 4:
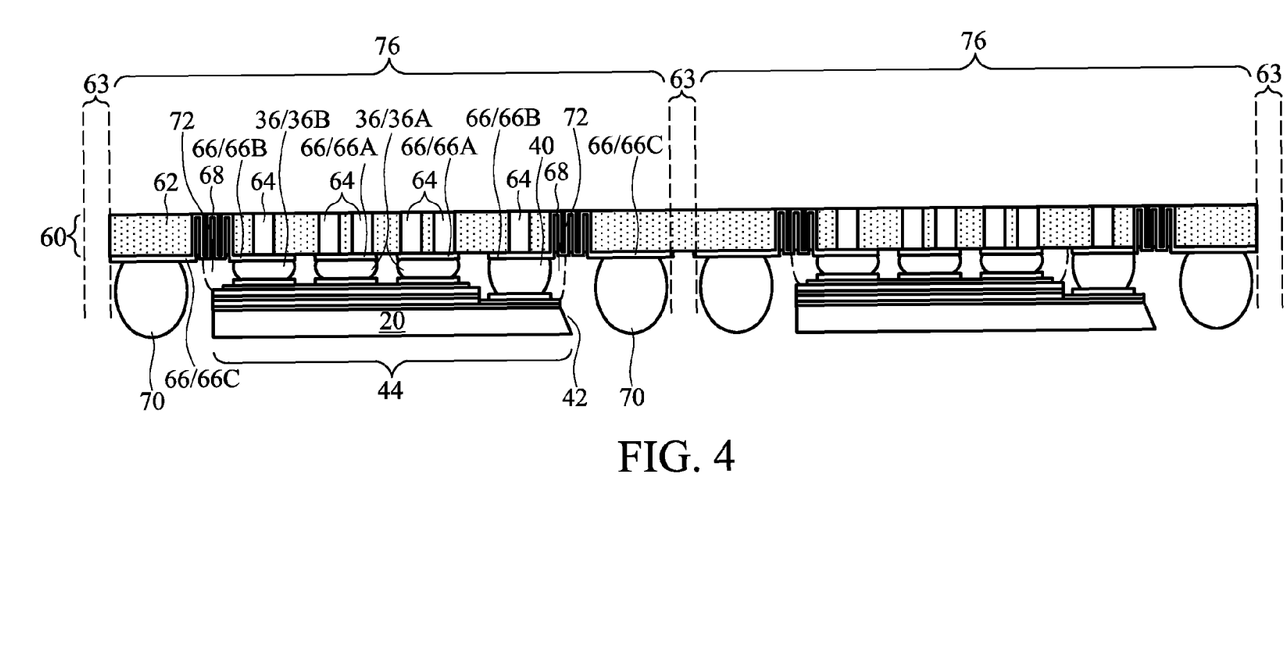

Referring to FIG. 4, a plurality of LED chips 44 diced from wafer 100 is bonded onto carrier wafer 60 through flip-chip bonding. During the bonding process, solder bumps 36 and 40 are re-flowed. Both solder bumps 36 and 40 have contact with the respective bond pads 66 and 34/38. It is further observed that higher solder bumps 70 are adjacent to LED chips 44, and are electrically connected to active solder bumps 66B, for example, through ohmic lines 68. The top ends of solder bumps 70 extend beyond the back surfaces of substrates 20. Optionally, underfill 72 may be filled into the gaps between LED chips 44 and carrier wafer 60. It is believed that bevel cuts 42 facilitate dispensing of underfill 72.

Figure 5A:
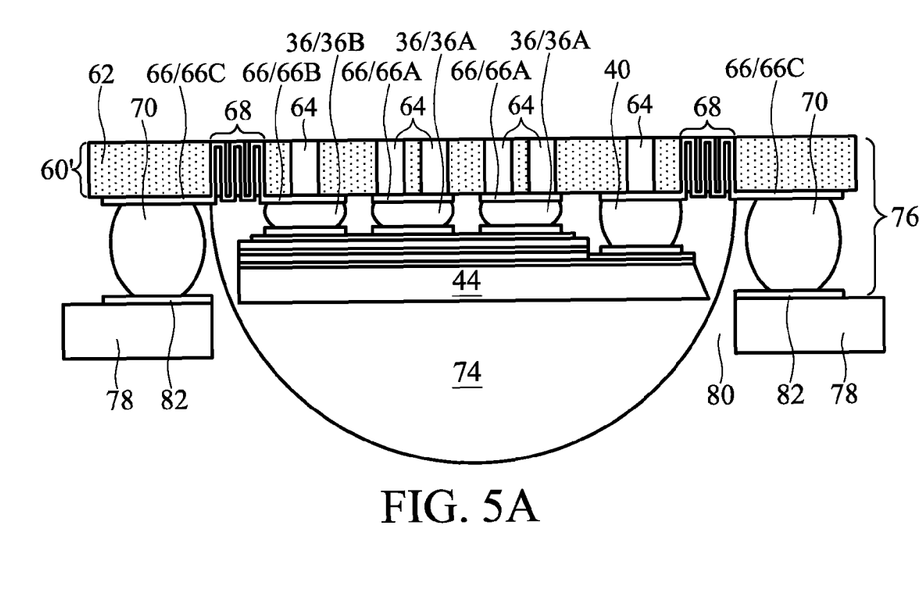

Carrier wafer 60 may then be sawed apart along scribe lines 63 and is separated into a plurality of package components 76, each comprising one of carrier chips 60' (FIG. 5A), with each carrier chip 60' being bonded onto at least one LED chip 44. Referring to FIG. 5A, silicone lens 74 is molded onto LED chips 44 to form package structure 76. Silicone lens 74 and its molding are known in the art, and hence details are not repeated herein. Silicone lens 74 may cover LED chip 44. In the case no underfill 72 is used, silicone will also fill in the gaps between LED chip 44 and carrier chip 60', so that silicone performs the function of underfill 72. In certain embodiments, solder bumps 70 are not covered by silicon lens 74 and are exposed.

Figure 5B:
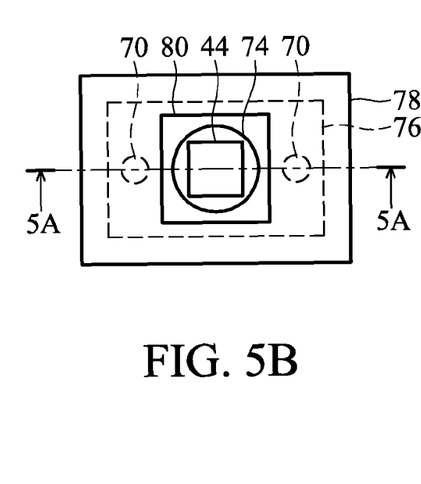

Referring again to FIG. 5A, package structure 76 is bonded onto window-type module substrate 78 through flip-chip bonding. Window-type module substrate 78 may be formed of FR4, a metal core-enhanced substrate, a ceramic substrate, or an organic substrate. Window-type module substrate 78 includes window 80, whose size fits the size of silicone lens 74. Accordingly, silicone lens 74 extends into window 80 and may include portions on opposite sides of window-type module substrate 78. Bond pads 82 are formed on window-type module substrate 78. After the re-flow of solder bumps 70, bond pads 82 are bonded onto bond pads 66C through solder bumps 70. The further electrical connection (not shown) is made to bond pads 82 in order to apply a voltage to LED chip 44, and a current will flow through the electrical connection, bond pads 82, and solder bumps 70. FIG. 5B illustrates a bottom view of the structure as shown in FIG. 5A, wherein the cross-sectional view shown in FIG. 5A is made in the plane crossing line 5A-5A in FIG. 5B.

Figure 6:
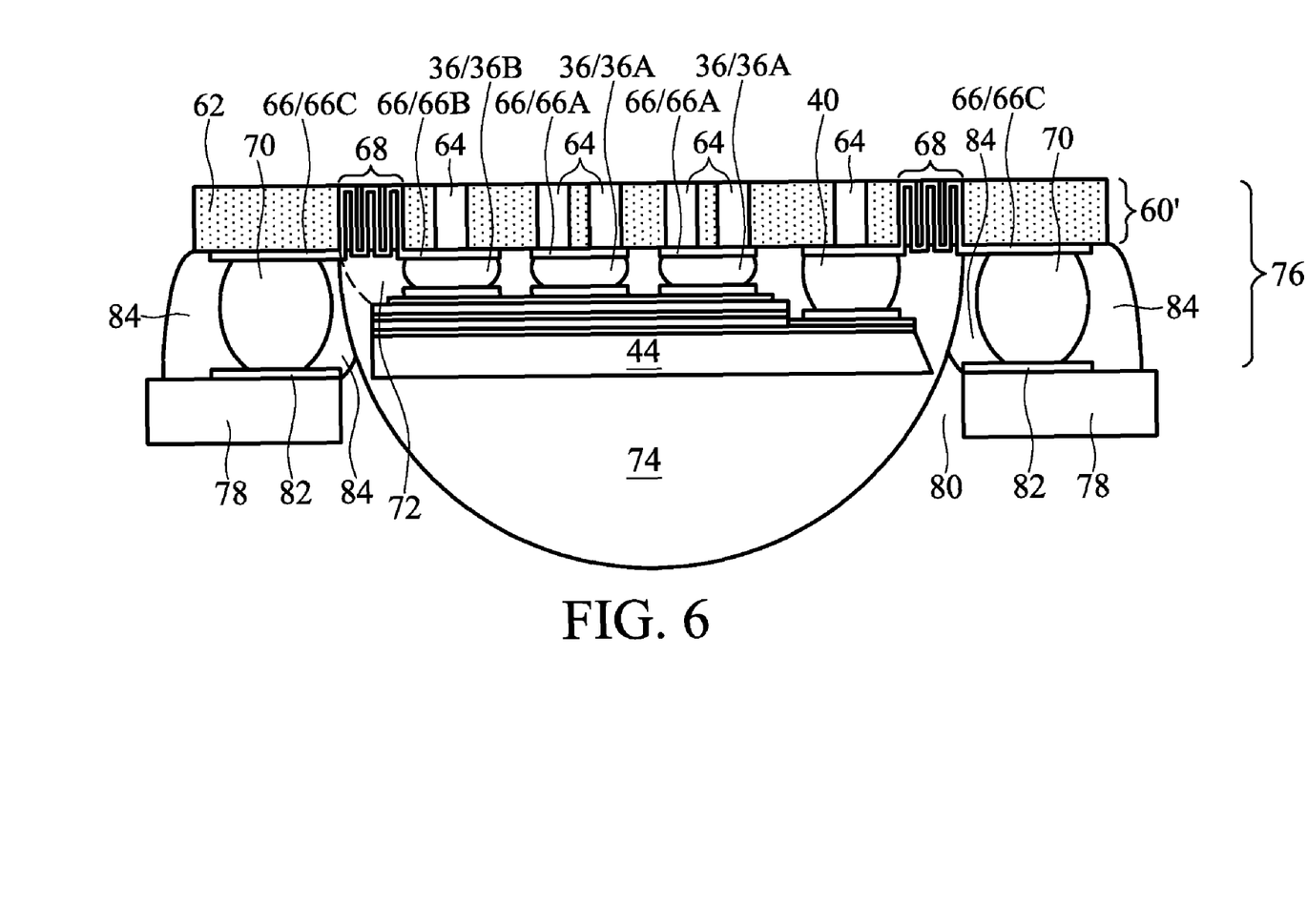
Figure 7:
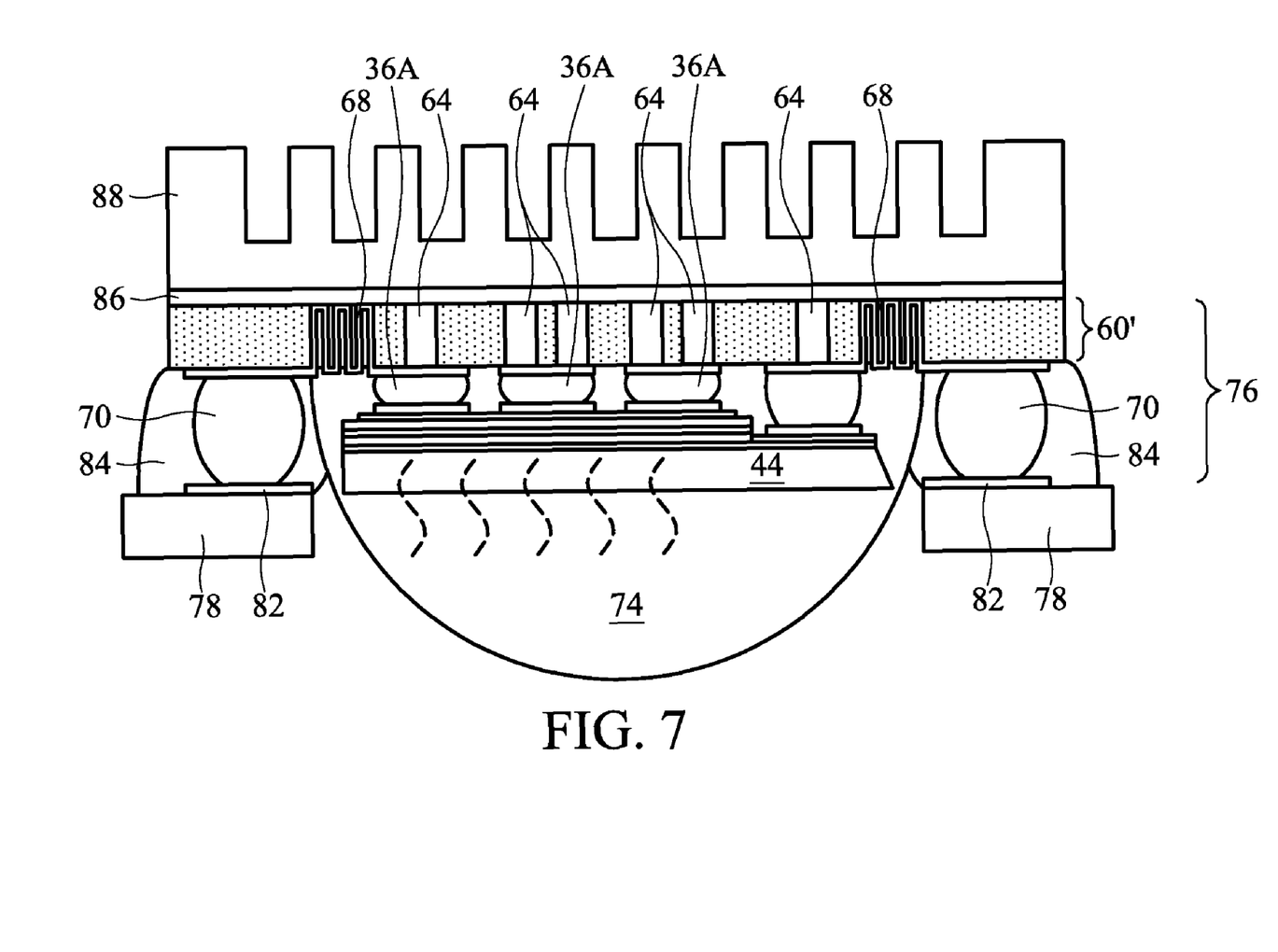

Referring to FIG. 6, underfill 84 is dispensed into the gap between package structure 76 and window-type module substrate 78 to protect solder bumps 70. Next, as shown in FIG. 7, heat sink 88 is mounted onto carrier chip 60', and is designed to be electrically isolated from the current I/Os. In an embodiment, heat sink 88 and carrier chip 60' are joined by TIM 86, which may be formed of a dielectric material that has a good thermal conductivity. TIM 86 may be formed of an organic paste or pure alloy or metal, which can be dispensed onto carrier chip 60', and thermal re-flowed or cured after heat sink 88 is mounted onto carrier chip 60'. The heat generated in LED chip 44 may thus be dissipated to carrier chip 60', and then to heat sink 88. It is observed that from LED chip 44 to heat sink 88, there is no material that has a low thermal conductivity. Accordingly, the thermal resistance in the path between LED chip 44 and heat sink 88 is low, and the heat-dissipating efficiency of the structure as described is high. The package component is thus suitable for being used for high-power LED devices where heat dissipation is important to optimal device operation.

Dummy solder bumps 36A do not have any current flowing through when a voltage is applied to LED chip 44 to emit light. However, dummy solder bumps 36A may help to conduct the heat generated in LED chip 44 through carrier chip 60' to heat sink 88.

The structure as described in conjunction with FIG. 7 is referred to as a double flip-chip package component since LED chip 44 is first bonded onto carrier chip 60' through flip-chip bonding, and the resulting package component is further bonded onto other circuit components, such as window-type module substrate 78 through an additional flip-chip bonding. Such bonding scheme enables light to emit in one direction (for example, to the bottom in FIG. 7), and heat to dissipate to the opposite direction. As a result, the efficiency for both the light emission and the heat dissipation is improved. For example, the heat generated in LED chip 44 may be dissipated through multiple dummy solder bumps 36A and thermal TSVs 64, through carrier chip 60', and into heat sink 88. Accordingly, the heat dissipating ability of the LED package component in accordance with various embodiments of the present invention is high and improved over conventional LED packages where the thermal path included materials having low thermal conductivity. Further, the light generated by LED chip 44 is emitted through substrate 20, made of clear material, and is not blocked by any wire or bond pad. Accordingly, the light output efficiency is improved over conventional LED packages where the light may be partially blocked by elements of the package.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A light-emitting device (LED) package component comprising:
    an LED chip;
    a carrier chip comprising:
        a first bond pad and a second bond pad on a surface of the carrier chip; and
        a third bond pad and a fourth bond pad on the surface of the carrier chip and electrically connected to the first bond pad and the second bond pad, respectively, wherein the first, the second, the third, and the fourth bond pads are on the same surface of the carrier chip;
    a first metal bump and a second metal bump bonding the first bond pad and the second bond pad, respectively, onto the LED chip through flip-chip bonding; and
    a window-type module substrate bonded onto the third and the fourth bond pads through flip-chip bonding, wherein the window-type module substrate comprises a window, with the LED chip configured to emit light toward the window.

2. The LED package component of claim 1 further comprising a lens covering the LED chip, with a portion of the lens penetrating through the window.

3. The LED package component of claim 1, wherein the LED chip comprises two electrodes electrically connected to the first bond pad and the second bond pad.

4. The LED package component of claim 1 further comprising a dummy through-substrate via (TSV) in the carrier chip, wherein the dummy TSV is electrically connected to the first metal bump, with the dummy TSV configured not to pass any current when the LED chip emits light.

5. The LED package component of claim 1 further comprising:
    a heat sink; and
    a thermal interface material (TIM) between and adjoining the heat sink and the carrier chip.

6. The LED package component of claim 5, wherein the carrier chip further comprises a dummy through-substrate via (TSV), and wherein the LED package component further comprises a dummy solder bump electrically connected to the dummy TSV to an electrode on a surface of the LED chip, wherein the dummy TSV comprises a first end connected to the electrode, and a second end insulated electrically.

7. The LED package component of claim 1, wherein the carrier chip comprises an ohmic line electrically coupled between the first and the third bond pads, and wherein the ohmic line is configured to regulate a current flowing through the LED chip.

8. The LED package component of claim 1, wherein the LED chip comprises:
    a transparent substrate;
    an active layer between the transparent substrate and the carrier chip; and
    a reflector between the active layer and the carrier chip, wherein the reflector is configured to reflect light emitted from the active layer towards the window.

9. A light-emitting device (LED) package component comprising:
    a window-type module substrate comprising:
        a window; and
        a first bond pad and a second bond pad on a surface of the window-type module substrate and adjacent to the window;
    a carrier chip comprising:
        a first bond pad and a second bond pad on a first side of the carrier chip; and
        a dummy through-substrate via (TSV) in the carrier chip;
    a first solder bump and a second solder bump bonding the first bond pad and the second bond pad of the window-type module substrate onto the first bond pad and the second bond pad of the carrier chip, respectively, through flip-chip bonding; and
    an LED chip bonded onto the carrier chip through flip-chip bonding, wherein the LED chip is on the first side of the carrier chip and overlapping at least a portion of the window.

10. The LED package component of claim 9 further comprising a lens covering the LED chip, with a portion of the lens extending through the window.

11. The LED package component of claim 9, wherein the LED chip comprises two electrodes electrically connected to the first bond pad and the second bond pad of the carrier chip.

12. The LED package component of claim 9 further comprising:
    a heat sink on a second side of the carrier chip opposite the first side; and
    a thermal interface material (TIM) between and adjoining the heat sink and the carrier chip.

13. The LED package component of claim 9 further comprising a dummy solder bump electrically connected to the dummy TSV to an electrode of the LED chip, wherein the dummy solder bump is configured to pass any current when a voltage is applied to the first bond pad and the second bond pad of the window-type module substrate.

14. The LED package component of claim 13, wherein the dummy TSV comprises a first end connected to the dummy solder bump, and a second end being electrically insulated.

15. The LED package component of claim 9, wherein the carrier chip further comprises an ohmic line electrically coupled to the first bond pad of the carrier chip, and wherein the ohmic line is configured to regulate a current flowing through the LED chip.

16. A light-emitting device (LED) package component comprising:
    a carrier chip comprising:
        a dummy through-substrate via (TSV) extending from a major side of the carrier chip to an opposite side of the carrier chip; and
        a first bond pad and a second bond pad on the major side of the carrier chip and electrically interconnected;
    a window-type module substrate bonded onto the first bond pad of the carrier chip through flip-chip bonding, wherein the window-type module substrate comprises a window; and an LED chip bonded onto the second bond pad of the carrier chip through flip-chip bonding.

17. The LED package component of claim 16 further comprising a lens covering the LED chip, with a portion of the lens extending from a first side of the window-type module substrate to a second side of the window-type module substrate opposite the first side.

18. The LED package component of claim 17, wherein the window-type module substrate encircles the lens.

19. The LED package component of claim 17 further comprising:
   a heat sink; and
   a thermal interface material (TIM) between and adjoining the heat sink and the carrier chip.

20. The LED package component of claim 16, wherein the window-type module substrate is ceramic or organic.

* * * * *